(12) United States Patent
Cheng et al.

(10) Patent No.: US 10,656,507 B2
(45) Date of Patent: May 19, 2020

(54) FOCUSING AND LEVELING MEASUREMENT DEVICE AND METHOD

(71) Applicant: SHANGHAI MICRO ELECTRONICS EQUIPMENT (GROUP) CO., LTD., Shanghai (CN)

(72) Inventors: Qi Cheng, Shanghai (CN); Feibiao Chen, Shanghai (CN); Xuting Wu, Shanghai (CN)

(73) Assignee: Shanghai Micro Electronics Equipment (Group) Co., Ltd., Shanghai (CN)

( * ) Notice: Subject to any disclaimer, the term of this patent is extended or adjusted under 35 U.S.C. 154(b) by 0 days.

(21) Appl. No.: 16/306,324

(22) PCT Filed: May 22, 2017

(86) PCT No.: PCT/CN2017/085354
§ 371 (c)(1),
(2) Date: Nov. 30, 2018

(87) PCT Pub. No.: WO2017/206755
PCT Pub. Date: Dec. 7, 2017

(65) Prior Publication Data
US 2019/0302582 A1 Oct. 3, 2019

(30) Foreign Application Priority Data

May 31, 2016 (CN) .......................... 2016 1 0379004

(51) Int. Cl.
*G03B 21/14* (2006.01)
*G01B 11/25* (2006.01)
(Continued)

(52) U.S. Cl.
CPC ............ *G03B 21/142* (2013.01); *G01B 11/25* (2013.01); *G02B 27/0955* (2013.01);
(Continued)

(58) Field of Classification Search
CPC ................ G01B 11/25; G02B 27/0955; G02B 27/0972; G03B 21/142; G03B 21/28; G03F 7/20; G03F 9/00
See application file for complete search history.

(56) References Cited

U.S. PATENT DOCUMENTS 4,356,392 A * 10/1982 Wittekoek ............ G03F 9/7026
250/201.4
4,558,949 A 12/1985 Uehara et al.
(Continued)

FOREIGN PATENT DOCUMENTS

CN 101201546 A 6/2008
CN 101201549 A 6/2008
(Continued)

*Primary Examiner* — Deoram Persaud
(74) *Attorney, Agent, or Firm* — Muncy, Geissler, Olds & Lowe, P.C.

(57) ABSTRACT

A measurement device and method for focusing and leveling are disclosed. The device includes a measuring optical path and a first monitoring optical path. Measuring light in the measuring optical path interacts with a wafer and is then incident on a measuring detector to form thereon a measuring mark. First monitoring light in the first monitoring optical path is incident on a measuring detector to form thereon a first monitoring mark. An error in a measurement result of the wafer that arises from a drift of the measuring detector can be eliminated by compensating for a vertical deviation of the wafer obtained by subtracting a drift of the first monitoring mark from a displacement of the measuring mark. In this way, measurement accuracy and stability can be improved by monitoring and correcting the drift of the measuring detector.

19 Claims, 5 Drawing Sheets

(51) Int. Cl.
  *G02B 27/09* (2006.01)
  *G03B 21/28* (2006.01)
  *G03F 7/20* (2006.01)
  *G03F 9/00* (2006.01)
(52) U.S. Cl.
  CPC ......... *G02B 27/0972* (2013.01); *G03B 21/28* (2013.01); *G03F 7/20* (2013.01); *G03F 9/00* (2013.01)

(56) References Cited

U.S. PATENT DOCUMENTS

| | | | | |
|---|---|---|---|---|
| 5,101,226 A | * | 3/1992 | Beaulieu | G03F 9/7023 355/53 |
| 5,124,562 A | * | 6/1992 | Kawashima | G01B 11/026 250/548 |
| 5,162,642 A | * | 11/1992 | Akamatsu | G03F 9/7026 250/201.6 |
| 5,216,235 A | * | 6/1993 | Lin | G01B 11/026 250/201.6 |
| 5,218,415 A | * | 6/1993 | Kawashima | G01B 11/26 250/237 R |
| 5,414,515 A | | 5/1995 | Kawashima | |
| 5,448,332 A | * | 9/1995 | Sakakibara | G03F 9/7026 355/53 |
| 5,742,067 A | * | 4/1998 | Imai | G03F 7/70358 250/548 |
| 6,081,614 A | * | 6/2000 | Yamada | G03F 7/70358 382/151 |
| 6,091,499 A | * | 7/2000 | Abraham | G01J 4/00 356/369 |
| 6,094,268 A | * | 7/2000 | Oshida | G03F 9/7049 250/548 |
| 6,195,154 B1 | * | 2/2001 | Imai | G03F 9/7034 355/53 |
| 6,479,832 B1 | * | 11/2002 | Naraki | G03F 9/7026 250/559.3 |
| 7,248,337 B2 | * | 7/2007 | Teunissen | G03F 9/7034 250/201.2 |
| 2002/0000520 A1 | * | 1/2002 | Kawaguchi | G01N 21/9501 250/492.1 |
| 2004/0000627 A1 | * | 1/2004 | Schuster | G02B 7/28 250/201.2 |
| 2004/0211920 A1 | | 10/2004 | Maria Derksen et al. | |
| 2009/0021750 A1 | * | 1/2009 | Korner | G01B 11/25 356/601 |
| 2016/0327875 A1 | * | 11/2016 | Song | G03F 9/7034 |
| 2019/0025718 A1 | * | 1/2019 | Fan | G03F 9/7034 |

FOREIGN PATENT DOCUMENTS

| | | |
|---|---|---|
| CN | 102087483 A | 6/2011 |
| CN | 103091990 A | 5/2013 |
| CN | 103365097 A | 10/2013 |
| CN | 104749901 A | 7/2015 |
| CN | 104954666 A | 9/2015 |
| CN | 105242501 A | 1/2016 |
| JP | H01112726 A | 5/1989 |
| JP | H1064806 A | 3/1998 |
| JP | 2002036373 A | 2/2002 |
| JP | 2003324028 A | 11/2003 |
| TW | 552464 B | 9/2003 |
| TW | 200919104 A | 5/2009 |
| TW | 201614365 A | 4/2016 |

* cited by examiner

FOCUSING AND LEVELING MEASUREMENT DEVICE AND METHOD

TECHNICAL FIELD

The present invention relates to a measurement device and method for focusing and leveling for use in the field of photolithography technology.

BACKGROUND

A projection photolithography tool is an equipment for projecting a pattern on a photomask onto the surface of a wafer using a projection objective. During exposure carried out by such a photolithography tool, the wafer may be out of focus or tilt relative to a focal plane of the projection objective due to thickness inconsistencies or surface shape irregularities of the wafer or changes in accuracy or reproducibility of the focal plane. As a result, some areas of the wafer surface in the exposure field of view may not be within an effective depth of focus, and the photolithography quality can be seriously impaired. For this reason, focusing and leveling is necessary for precise positional control over the wafer within the exposure field of view, and the measurement accuracy of the used measurement device for focusing and leveling plays an extremely critical role. With the requirements for photolithography processes continuing to increase, the measurement accuracy of such measurement devices for focusing and leveling must be continuously improved accordingly. Measurement stability is one of the several factors determining the measurement accuracy, including not only those related to the environment, such as temperature and pressure, but also a drift of a used detector incurred by its power consumption and the like.

As shown in FIG. 1, in a conventional measurement device for focusing and leveling, light from a light source 1 propagates through an illumination lens group 2, slits 3 and a projection lens group 4 and is incident on a wafer 5. The reflected light from the wafer 5 passes through a detecting lens group 6 and is incident on a linear charge coupled device (CCD) in a detector 7, creating a light spot thereon. Monitoring positional variations of the spot on the linear CCD enables calculation of a defocus amount of the wafer 5. This technique, however, neither takes into account the influence of a drift of the detector 7 itself on the measurement result, nor does it monitor the drift of the detector 7, despite the fact that the drift of the detector 7 may cause deviation in the measurement result, deteriorate the device's measurement accuracy and adversely affect its measurement stability.

SUMMARY OF THE INVENTION

It is therefore an objective of the present invention to provide a measurement device and method for focusing and leveling with the capabilities of monitoring and correcting a detector drift.

To this end, the subject matter of the present invention lies in a measurement device for focusing and leveling, including a measuring optical path, a first monitoring optical path and a measuring detector, the measuring optical path including, sequentially along a direction of propagation of light, a measuring illumination unit, a projection lens group, a detecting lens group and a measuring prism, the measuring illumination unit being configured to emit a measuring light which is projected by the projection lens group onto a wafer and reflected by the wafer onto the measuring detector after propagating through the detecting lens group and the measuring prism, thereby forming a measuring mark;

the first monitoring optical path including, sequentially along a direction of propagation of light, a first monitoring illumination unit and the measuring prism, the first monitoring illumination unit being configured to emit a first monitoring light which enters the measuring prism and is then projected onto the measuring detector, thereby forming a first monitoring mark.

Preferably, the measuring illumination unit includes a measuring light source and measuring slits corresponding to the measuring light source, and the first monitoring illumination unit includes a first monitoring light source and first monitoring slits corresponding to the first monitoring light source.

Preferably, the measuring light source is provided with a first filter and the first monitoring light source with a third filter.

Preferably, the projection lens group includes, sequentially along the direction of propagation of light, a first projection lens, a projection aperture assembly and a second projection lens.

Preferably, the projection lens group further includes a first reflector, the detecting lens group further includes a second reflector, wherein the measuring light is reflected by the first reflector onto the wafer, reflected by the wafer onto the second reflector, and reflected by the second reflector onto the detecting lens group.

Preferably, a measuring relay lens group is disposed between the measuring prism and the measuring detector.

Preferably, the light in the measuring optical path is in a same wavelength band as the light in the first monitoring optical path.

Preferably, the measurement device for focusing and leveling further includes: a reference optical path corresponding to the measuring optical path: a second monitoring optical path corresponding to the first monitoring optical path; and a reference detector.

Preferably, the reference optical path includes, sequentially along the direction of propagation of light, a reference light source, a second filter and reference slits, the reference light source being configured to emit a reference light which passes through the second filter and the reference slits and is then projected by the projection lens group into the measuring optical path onto a third reflector, reflected by the third reflector and projected by the detecting lens group and a detecting prism onto the reference detector, thereby forming a reference mark.

Preferably, the measuring light and the reference light are in different wavelength bands.

Preferably, the measuring light is visible light and the reference light is infrared light.

Preferably, a measuring relay lens group is disposed between the measuring prism and the measuring detector, with a reference relay lens group being disposed between the reference prism and the reference detector.

Preferably, the light in the measuring optical path transmits through the projection prism and the detecting prism, and wherein the light in the reference optical path is reflected at the projection prism and at the detecting prism.

Preferably, the third reflector is disposed on a bottom surface of the projection objective.

Preferably, the projection lens group further includes a beam-splitting prism, with the detecting lens group further including a beam-combining prism, wherein the measuring light and the reference light are reflected at different surfaces of the beam-splitting prism and at different surfaces of the beam-combining prism.

Preferably, the measuring light is in a same wavelength band as the first monitoring light, while the reference light is in a same wavelength band as the second monitoring light.

Preferably, the second monitoring optical path includes a second monitoring light source, second monitoring slits and a fourth filter, the second monitoring light source being configured to emit a second monitoring light which passes through the second monitoring slits and the fourth filter and is projected onto the reference detector, thereby forming a second monitoring mark.

A measurement method for focusing and leveling includes the steps of:

1) measuring a wafer by using a measuring light, the measuring light forming a measuring mark on a measuring detector, and forming a first monitoring mark on the measuring detector from a first monitoring light;

2) respectively comparing current positions of the measuring mark and the first monitoring mark on the measuring detector with initial positions of the measuring mark and the first monitoring mark on the measuring detector;

3) calculating a displacement of the measuring mark and a drift of the first monitoring mark, based on a result of the comparison in step 2); and 4) obtaining a compensation for a vertical deviation of the wafer by subtracting the drift from the displacement.

Preferably, step 1) further includes: providing a reference light and forming a reference mark on a reference detector from the reference light that propagates in a same direction as the measuring light but does not interact with a surface of the wafer, and providing a second monitoring light and forming a second monitoring mark on the reference detector from the second monitoring light, wherein:

step 2) further includes respectively comparing current positions of the reference mark and the second monitoring mark on the reference detector with initial positions of the reference mark and the second monitoring mark on the reference detector;

step 3) further includes calculating a drift of the reference mark and a drift of the second monitoring mark; and step 4) further includes obtaining an optical path drift by subtracting the drift of the second monitoring mark from the drift of the reference mark and obtaining a vertical deviation of the wafer by subtracting both the drift of the first monitoring mark and the optical path drift from the displacement of the measuring mark.

Compared to the prior art, according to the present invention, an error in a measurement result of the wafer that arises from a drift of the measuring detector can be eliminated by compensating for a vertical deviation of the wafer by subtracting a drift of the first monitoring mark formed on the measuring detector by the first monitoring optical path from a displacement of the measuring mark formed on the measuring detector by the measuring optical path involving the wafer. In this way, measurement accuracy and stability can be improved by monitoring and correcting the drift of the measuring detector.

BRIEF DESCRIPTION OF THE DRAWINGS

In FIG. 1: 1—light source; 2—illumination lens group; 3—slits; 4—projection lens group; 5—wafer; 6—detecting lens group; 7—detector.

In FIGS. 2 to 4: 101—measuring light source; 102—first filter; 103—measuring slits; 104—first projection lens; 105—projection aperture assembly; 106—second projection lens; 107—first reflector; 108—wafer; 109—workpiece stage; 110—second reflector; 111—first detecting lens; 112—second detecting lens; 113—measuring prism; 114—measuring relay lens group; 115—measuring detector; 116—first monitoring slits; 117—third filter; 118—first monitoring light source; 119—projection objective.

In FIGS. 5 to 8: r1-r2—features of a first monitoring mark; R1-R2—initial positions of the features of the first monitoring mark; d1-d3—features of a measuring mark; D1—initial position of the feature d2 of the measuring mark; r3—r4—features of a second monitoring mark; R3-R4—initial positions of the features of the second monitoring mark; d4-d6—features of a reference mark; D2—initial position of the feature d5 of the reference mark.

In FIG. 9: 201—measuring light source; 202—first filter; 203—measuring slits; 204—reference light source; 205—second filter; 206—reference slits; 207—projection prism; 208—first projection lens; 209—projection aperture assembly; 210—second projection lens; 211—beam—splitting prism; 212—wafer; 213—workpiece stage; 214—beam—combining prism; 215—first detecting lens; 216—second detecting lens; 217—detecting prism; 218—measuring prism; 219—measuring relay lens group; 220—measuring detector; 221—first monitoring slits; 222—third filter; 223—first monitoring light source; 224—reference prism; 225—second monitoring slits; 226—fourth filter; 227—second monitoring light source; 228—reference relay lens group; 229—reference detector; 230—projection objective; 231—third reflector.

DETAILED DESCRIPTION OF PREFERRED EMBODIMENTS

The present invention will be described in detail below with reference to the accompanying drawings.

EMBODIMENT 1

Figure 1:
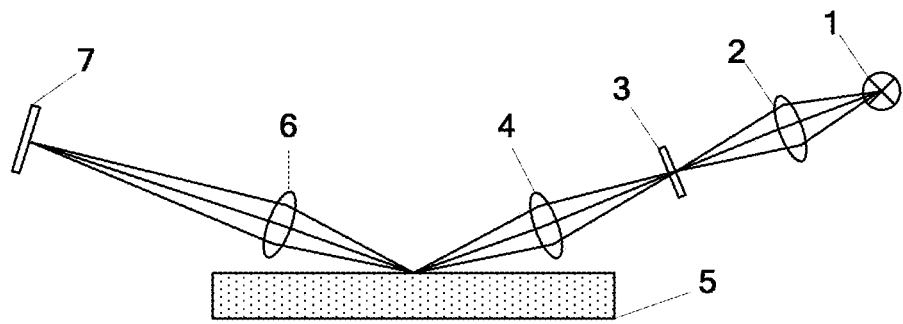
FIG. 1 is a structural schematic of a conventional measurement device for focusing and leveling.
Figure 2:
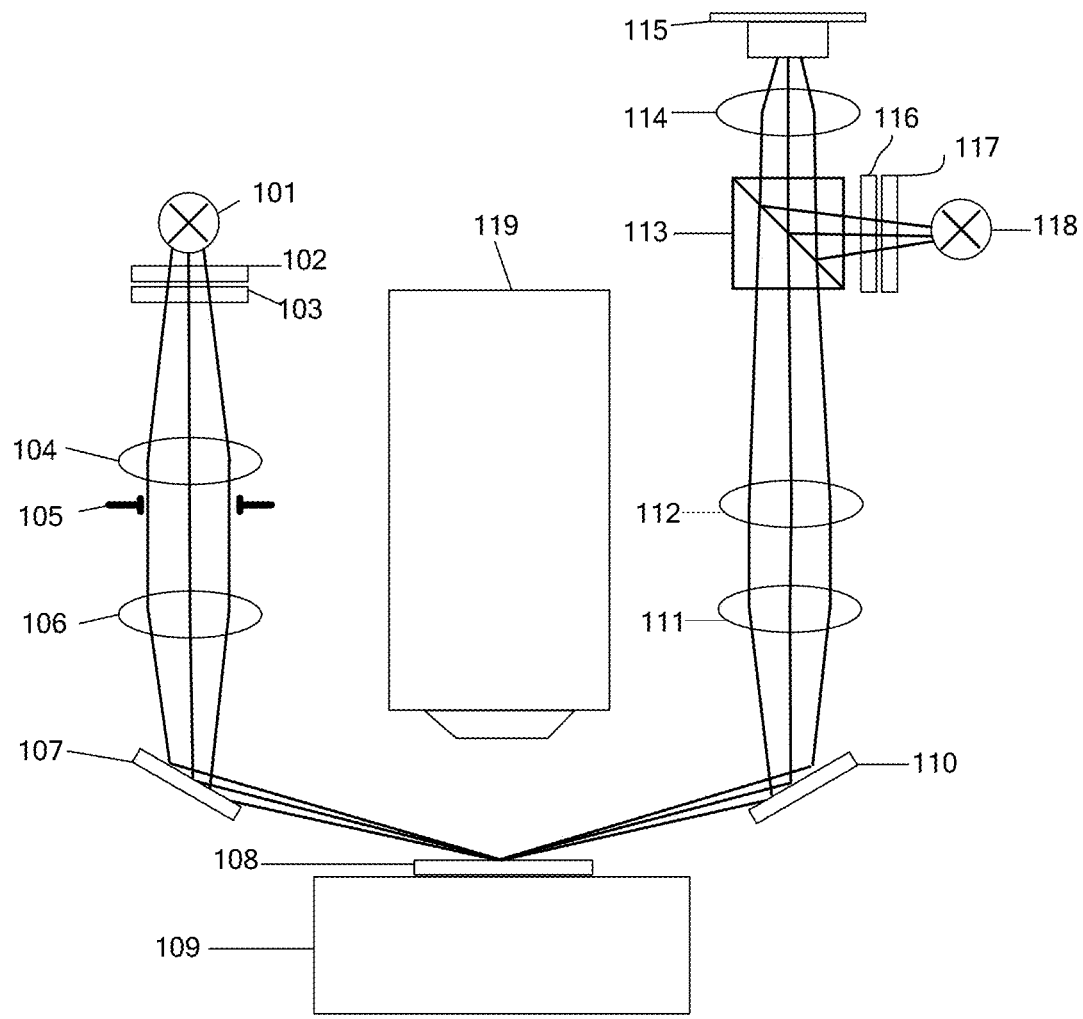
FIG. 2 is a structural schematic of a measurement device for focusing and leveling according to one embodiment of the present invention.

As shown in FIG. 2, a measurement device for focusing and leveling according to the present invention includes a measuring optical path, a first monitoring optical path and a measuring detector 115. The measuring optical path includes, disposed sequentially along the direction of propagation of light, a measuring light source 101, measuring slits 103, a projection lens group, a detecting lens group and a measuring prism 113. The projection lens group and the detecting lens group are so positioned as to allow light exiting the projection lens group to be reflected by an object under measurement (a wafer 108 in this embodiment) and incident on the detecting lens group. As a result, measuring light emanated from the measuring light source 101 can finally reach the measuring detector 115 and form thereon a measuring mark containing information about the object under measurement. The first monitoring optical path includes, disposed sequentially along the direction of propagation of light, a first monitoring light source 118, first monitoring slits 116 and the measuring prism 113. First monitoring light emanated from the first monitoring light source 118 is configured to be finally incident on the measuring detector 115 and create a first monitoring mark on the measuring detector 115. The wafer 108 is placed on a workpiece stage 109 under the projection objective 119.

Figure 3:
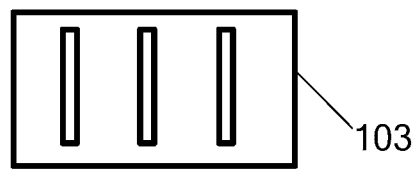
FIG. 3 is a structural schematic of measuring slits according to one embodiment of the present invention.

Specifically, the measuring light produced by the measuring light source 101 may be filtered by a first filter 102 into visible light in a wavelength band differing from a wavelength band of the exposing light. The visible light may then pass through the measuring slits 103 to define the measuring mark and then sequentially propagate through a first projection lens 104, a projection aperture assembly 105 and a second projection lens 106. That is, the projection aperture assembly 105 is disposed between the first projection lens 104 and the second projection lens 106. After exiting, the light may be reflected by a first reflector 107 onto the surface of the wafer 108 and again reflected by the wafer 108. The reflected light may be then further reflected by a second reflector 110 to a first detecting lens 111 and collimated by the first detecting lens 111 into parallel light. The parallel light may be then converged by a second detecting lens 112 and transmit through the measuring prism 113. After that, the light may further propagate through a measuring relay lens group 114 and reach the measuring detector 115. As shown in FIG. 3, the number of the measuring slits 103 may be three so that the resulting measuring mark consists of three features corresponding to the respective slits.

Figure 4:
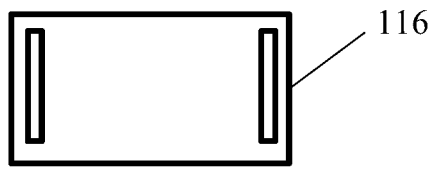
FIG. 4 is a structural schematic of first monitoring slits according to one embodiment of the present invention.

Further, the first monitoring light from the first monitoring light source 118 may be filtered by a third filter 117 into visible light in the same wavelength band as the aforesaid visible light in the measuring optical path. The visible light may then pass through the first monitoring slits 116 to define the first monitoring mark. After that, it may be reflected by the measuring prism 113 and then passes through the measuring relay lens group 114 to reach the measuring detector 115. As shown in FIG. 4, the number of the first monitoring slits 116 may be two so that the resulting first monitoring mark consists of two features corresponding to the respective slits.

Figure 5:
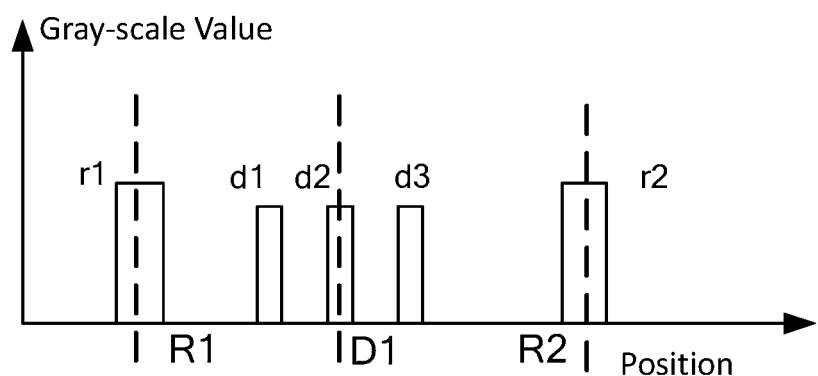
FIG. 5 is a schematic view of a measuring mark and a first monitoring mark on a measuring detector.

FIG. 5 is a schematic view of the measuring mark and the first monitoring mark formed on the measuring detector 115, where the horizontal axis represents the positions of the measuring mark and the first monitoring mark formed on the measuring detector 115, whereas the vertical axis represents their gray-scale values. In addition, the three features of the measuring mark are indicated respectively at d1, d2 and d3 and those of the first monitoring mark at r1 and r2. As can be seen from the figure, the measuring mark features d1, d2 and d3 are located between the two first monitoring mark features r1 and r2. Further, in the figure, D1 denotes an initial position of the measuring mark feature d2, and R1 and R2 denote initial positions of the first monitoring mark features r1 and r2.

Figure 6:
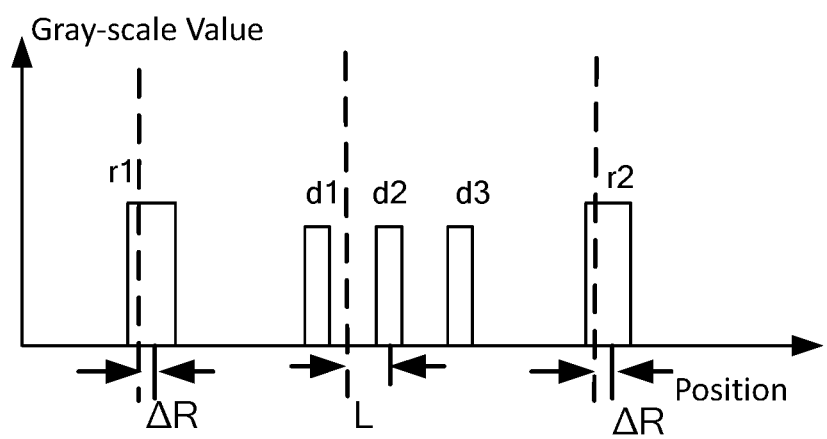
FIG. 6 is a schematic view showing drifting of the measuring mark and the first monitoring mark on the measuring detector.

In normal operation in which the measuring detector 115 remains at the same position without a drift, the first monitoring mark features r1, r2 will be always situated at their respective initial positions R1, R2 on the measuring detector 115. However, as shown in FIG. 6, when a drift of the measuring detector 115 occurs due to displacement caused by heat dissipation or other reasons, assuming a measured shift $\Delta R$ of each of the first monitoring mark features r1, r2 on the measuring detector 115 and a measured displacement L of the measuring mark feature d2 on the measuring detector 115, a vertical deviation D of the wafer 108 can be obtained as:

$$D = L - \Delta R.$$

Accordingly, the present invention also provides a measurement method for focusing and leveling, including the steps of:

1) forming the measuring mark on the measuring detector 115 from the measuring light that has illuminated the wafer 108 and forming the first monitoring mark on the measuring detector 115 from the first monitoring light, wherein the measuring light is successively emanated from the measuring light source 101, directed through the measuring slits 103 to define the measuring mark, converged by the projection lens group onto the wafer 108, reflected by the wafer 108, collimated by the detecting lens group into parallel light, guided through the measuring prism 113 and incident on the measuring detector 115, and wherein the first monitoring light is successively emanated from the first monitoring light source 118, directed through the first monitoring slits 116 to define the first monitoring mark, reflected by the measuring prism 113 and incident on the measuring detector 115;

2) comparing the current positions respectively of the measuring mark and the first monitoring mark on the measuring detector 220 with their respective initial positions on the measuring detector 220, wherein the initial positions are the positions respectively of the measuring mark and the first monitoring mark on the measuring detector 220 recorded in an initialized state without a drift of the measuring detector 220;

3) calculating a displacement of the measuring mark and a drift of the first monitoring mark, based on a result of the comparison in step 2; and 4) obtaining a compensation for a vertical deviation of the wafer by subtracting the drift from the displacement. Based on this compensation, the vertical deviation of the wafer can be corrected as desired.

According to this embodiment, the difference between the displacement of the measuring mark and the drift of the first monitoring mark is taken as a vertical deviation of the wafer 108 and used as a basis for correcting the vertical deviation of the wafer 108 so as to eliminate any error in the wafer measurement result arising from the drift of the measuring detector 115 itself. In this way, measurement accuracy and stability can be improved by monitoring and correcting the drift of the measuring detector 115.

EMBODIMENT 2

Figure 9:
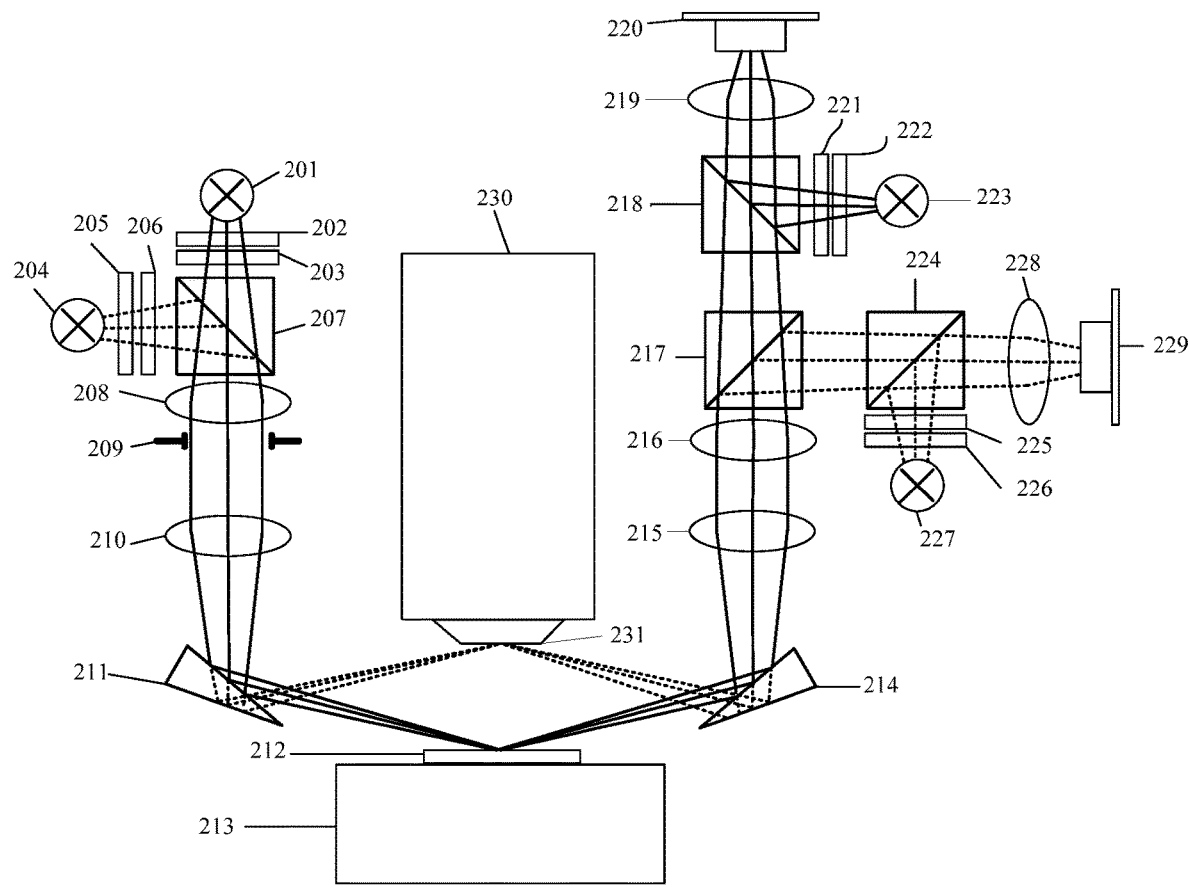
FIG. 9 is a structural schematic of a measurement device for focusing and leveling according to one embodiment of the present invention.

As shown in FIG. 9, a measurement device for focusing and leveling according to the present invention includes a measuring optical path, a first monitoring optical path and a measuring detector, a reference optical path, a second monitoring optical path and a reference detector.

The measuring optical path includes, disposed sequentially along the direction of propagation of light, a measuring light source 201, measuring slits 203, a projection prism 207, a projection lens group, a beam-splitting prism 211, a beam-combining prism 214, a detecting lens group, a detecting prism 217 and a measuring prism 218. The beam-splitting prism 211 and the beam-combining prism 214 are so positioned as to allow light exiting the beam-splitting prism 211 to be reflected by an object under measurement (a wafer 212 in this embodiment) and incident on the beam-combining prism 214. As a result, measuring light emanated from the measuring light source 201 can finally reach the measuring detector 220 and form a measuring mark on the measuring detector 220. The first monitoring optical path includes, disposed sequentially along the direction of propagation of light, a first monitoring light source 223, first monitoring slits 221 and the measuring prism 218. First monitoring light emanated from the first monitoring light source 223 is configured to be finally incident on the measuring detector 220 and create a first monitoring mark on the measuring detector 220. The wafer 212 is placed on a workpiece stage 213.

The reference optical path includes, disposed sequentially along the direction of propagation of light, a reference light source 204, reference slits 206, the projection prism 207, the projection lens group, the beam-splitting prism 211, a third reflector 231, the beam-combining prism 214, the detecting lens group, the detecting prism 217 and a reference prism 224. Reference light emanated from the reference light source 204 is configured to be finally incident on the reference detector 229 and create a reference mark on the reference detector 229. The second monitoring optical path includes, disposed sequentially along the direction of propagation of light, a second monitoring light source 227, second monitoring slits 225 and the reference prism 224. Second monitoring light emanated from the second monitoring light source 227 is configured to be finally incident on the reference detector 229 and create thereon a second monitoring mark.

Specifically, the measuring light produced by the measuring light source 201 may be filtered by a first filter 202 into visible light in a wavelength band differing from a wavelength band of the exposing light. The visible light may then pass through the measuring slits 203 to define the measuring mark and then sequentially propagate through the projection prism 207, a first projection lens 208, a projection aperture assembly 209 and a second projection lens 210. After exiting, the light may be reflected by a top surface of the beam-splitting prism 211 onto the surface of the wafer 212 and again reflected by the wafer 212. The reflected light may be then further reflected by a top surface of the beam-combining prism 214 onto a first detecting lens 215 and collimated by the first detecting lens 215 into parallel light. The parallel light may be then converged by a second detecting lens 216 and transmit through the detecting prism 217 and the measuring prism 218. After that, the light may further propagate through the measuring relay lens group 219 and reach the measuring detector 220.

The first monitoring light from the first monitoring light source 223 may be filtered by a third filter 222 into visible light in the same wavelength band as the aforesaid visible light in the measuring optical path. The visible light may then pass through the first monitoring slits 221 to define the first monitoring mark. After that, the light may be reflected by the measuring prism 218 and then pass through the measuring relay lens group 219 to reach the measuring detector 220.

The reference light from the reference light source 204 may be filtered by a second filter 205 into infrared light in a wavelength band differing from the wavelength band of the light from the measuring light source 201. The infrared light may then pass through the reference slits 206 to define the reference mark and is then reflected by the projection prism 207. The reflected infrared light may then propagate through the first projection lens 208, the projection aperture assembly 209 and the second projection lens 210. After exiting, the light may be reflected by a bottom surface of the beam-splitting prism 211 onto the third reflector 231 disposed under the projection objective 230 and again reflected thereby. The reflected light may be then further reflected by a bottom surface of the beam-combining prism 214 onto the first detecting lens 215 and collimated by the first detecting lens 215 into parallel light. The parallel light may be then converged by the second detecting lens 216 and transmit through the detecting prism 217 and the reference prism 224. After that, it may further propagate through a reference relay lens group 228 and reach the reference detector 229.

The second monitoring light from the second monitoring light source 227 may be filtered by a fourth filter 226 into infrared light in the same wavelength band as the aforesaid infrared light in the reference optical path. The infrared light may then pass through the second monitoring slits 225 to define the second monitoring mark. After that, the light may be reflected by the reference prism 224 and then pass through the reference relay lens group 228 to reach the reference detector 229.

Although the measuring light and the reference light have been described in this embodiment above as being implemented as visible light and infrared light, respectively, the present invention is not so limited, and those skilled in the art will appreciate that they may also be implemented as light in other wavelength bands.

Referring to FIG. 3, the number of the measuring slits 203 may be three so that the resulting measuring mark consists of three features corresponding to the respective measuring slits. Similarly, the number of the reference slits 206 may be three so that the resulting reference mark consists of three features corresponding to the respective reference slits.

Referring to FIG. 4, the number of the first monitoring slits 221 may be two so that the resulting first monitoring mark consists of two features corresponding to the respective first monitoring slits. Similarly, the number of the second monitoring slits 225 may be two so that the resulting second monitoring mark consists of two features corresponding to the respective second monitoring slits.

FIG. 5 is a schematic view of the measuring mark and the first monitoring mark formed on the measuring detector 220, where the horizontal axis represents the positions of the measuring mark and the first monitoring mark formed on the measuring detector 220, whereas the vertical axis represents their gray-scale values. In addition, the three features of the measuring mark are indicated respectively at d1, d2 and d3 and those of the first monitoring mark at r1 and r2. As can be seen from the figure, the measuring mark features d1, d2 and d3 are located between the two first monitoring mark features r1 and r2. Further, in the figure, D1 denotes an initial position of the measuring mark feature d2, and R1 and R2 denote initial positions of the first monitoring mark features r1 and r2.

Figure 7:
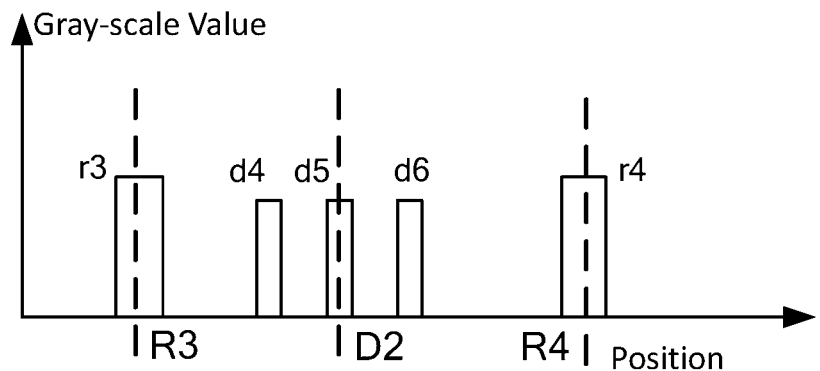
FIG. 7 is a schematic view of a reference mark and a second monitoring mark on a reference detector.

FIG. 7 is a schematic view of the reference mark and the second monitoring mark formed on the reference detector 229, where the horizontal axis represents the positions of the reference mark and the second monitoring mark formed on the reference detector 229, whereas the vertical axis represents their gray-scale values. In addition, the three features of the reference mark are indicated respectively at d4, d5 and d6 and those of the second monitoring mark at r3 and r4. As can be seen from the figure, the measuring mark features d4, d5 and d6 are located between the two second monitoring mark features r3 and r4. Further, in the figure, D2 denotes an initial position of the reference mark feature d5, and R3 and R4 denote initial positions of the second monitoring mark features r3 and r4.

Figure 8:
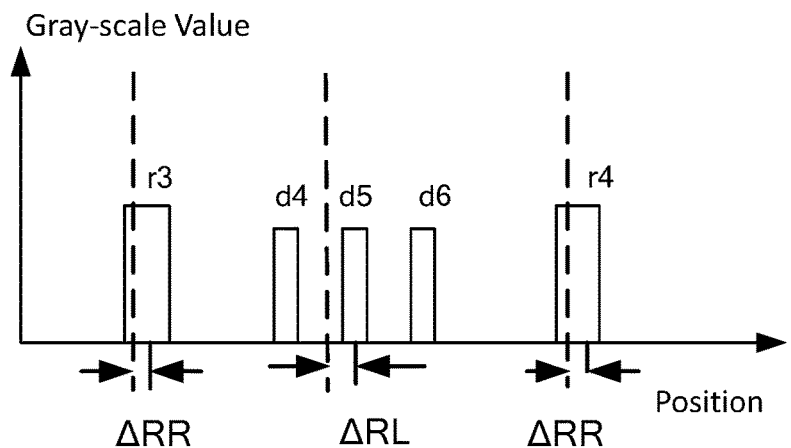
FIG. 8 is a schematic view showing drifting of the reference mark and the second monitoring mark on the reference detector.

In normal operation in which the reference detector 229 remains at the same position without a drift, the second monitoring mark features r3, r4 will be always situated at their respective initial positions R3, R4 on the reference detector 229. However, as shown in FIG. 8, when a drift of the reference detector 229 occurs due to displacement caused by heat dissipation or other reasons, assuming a shift $\Delta RR$ of each of the second monitoring mark features r3, r4 on the reference detector 229 and a drift $\Delta RL$ of the reference mark feature d5 on the reference detector 229 occurring due to environmental factors such as temperature and pressure that affect the whole optical path, an optical path drift $\Delta L$ can be obtained as:

$$\Delta L = \Delta RL - \Delta RR.$$

In normal operation in which the measuring detector 220 remains at the same position without a drift, the first monitoring mark features r1, r2 will be always situated at their respective initial positions R1, R1 on the measuring detector 220. However, as shown in FIG. 6, when a drift of the measuring detector 220 occurs due to displacement caused by heat dissipation or other reasons, assuming a shift $\Delta R$ of the first monitoring mark features r1, r2 on the measuring detector 220 and a displacement L of the measuring mark feature d2 on the measuring detector 220, a vertical deviation D of the wafer 212 can be obtained as:

$$D = L - \Delta R - \Delta L$$
$$= L - \Delta R - \Delta RL + \Delta RR.$$

Figure 10:
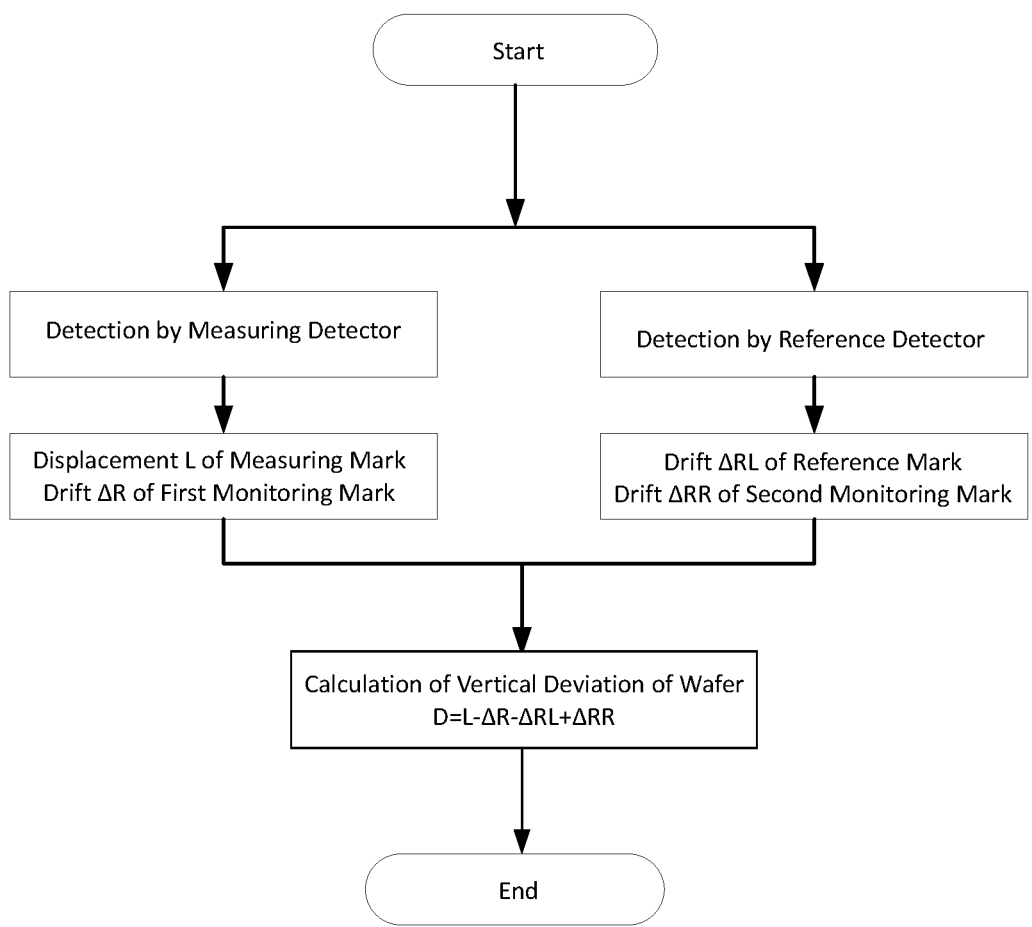
FIG. 10 is a flowchart of a measurement method for focusing and leveling according to one embodiment of the present invention.

Accordingly, referring to FIG. 10, the present invention also provides a measurement method for focusing and leveling, including the steps of:

1) forming the measuring mark on the measuring detector 220 from the measuring light that has illuminated the wafer 212, forming the first monitoring mark on the measuring detector 220 from the first monitoring light, forming the reference mark on the reference detector 229 from the reference light that propagates in the same direction as the measuring light but does not interact with the surface of the wafer 212, and forming the second monitoring mark on the reference detector 229 from the second monitoring light, wherein the measuring light is successively emanated from the measuring light source 201, directed through the measuring slits 203 to define the measuring mark and through the projection prism 207 and the projection lens group, converged by the projection lens group, reflected by the beam-splitting prism 211, the wafer 212 and the beam-combining prism 214, collimated by the detecting lens group into parallel light, guided through the detecting prism 217 and the measuring prism 218 and incident on the measuring detector 220, and the first monitoring light is emanated from the first monitoring light source 223, directed through the first monitoring slits 221 to define the first monitoring mark, reflected by the measuring prism 218 and incident on the measuring detector 220, and wherein the reference light is successively emanated from the reference light source 204, directed through the reference slits 206 to define the reference mark, reflected by the projection prism 207, converged by the projection lens group, reflected by the beam-splitting prism 211, the third reflector 231 and the beam-combining prism 214, collimated by the detecting lens group into parallel light, reflected by the detecting prism 217, guided through the reference prism 224 and incident on the reference detector 229, and the second monitoring light is successively emanated from the second monitoring light source 227, directed through the second monitoring slits 225 to define the second monitoring mark, reflected by the reference prism 224 and incident on the reference detector 229;

2) comparing the current positions respectively of the reference mark and the second monitoring mark on the reference detector 229 with their respective initial positions on the reference detector 229, wherein the initial positions are the positions respectively of the reference mark and the second monitoring mark on the reference detector 229 recorded in an initialized state without a drift of the reference detector 229 or an optical path drift, and comparing the current positions respectively of the measuring mark and the first monitoring mark on the measuring detector 220 with their respective initial positions thereon, wherein the initial positions are the positions respectively of the measuring mark and the first monitoring mark on the measuring detector 220 recorded in an initialized state without a drift of the measuring detector 220 or an optical path drift;

3) based on results of the comparisons in step 2, calculating a drift of the reference mark and a drift of the second monitoring light and calculating a displacement of the measuring mark and a drift of the first monitoring light;

4) obtaining an optical path drift by subtracting the drift of the second monitoring mark from the drift of the reference mark and obtaining a vertical deviation of the wafer 212 by subtracting both the drift of the first monitoring mark and the optical path drift from the displacement of the measuring mark.

According to this embodiment, an error in a measurement result of the wafer 212 that arises from the drift of the measuring detector 220 and from the optical path drift occurring due to environmental factor such as the ambient temperature and pressure can be eliminated by compensating for the vertical deviation of the wafer 212 obtained by subtracting both the drift of the first monitoring mark and the optical path drift from the displacement of the measuring mark. In this way, measurement accuracy and stability can be improved by monitoring and correcting the drift of the measuring detector 220 and the optical path drift. Additionally, as the light in the measuring optical path and the light in the reference optical path are in different wavelength bands, crosstalk between the two optical paths within the lens barrel can be avoided. Further, the beam-splitting prism 211 enables the measuring optical path and the reference optical path to traverse the top surface of the wafer 212 and the bottom surface of the projection objective 230, respectively. Coupled with the accommodation of both the measuring optical path and the reference optical path by the beam-combining prism 214, it is made possible to evacuate the wafer 212 from the reference optical path while not requiring any other separate device and making the two optical paths to follow the substantially same route. In this way, the optical path drift is decoupled from the measurement result to facilitate the compensation for the wafer 212 and allow a simple structure.

What is claimed is:

1. A measurement device for focusing and leveling, comprising a measuring optical path, a first monitoring optical path, a measuring detector, a reference optical path corresponding to the measuring optical path, and a reference detector,
    the measuring optical path comprising, sequentially along a direction of propagation of light, a measuring illumination unit, a projection lens group, a detecting lens group and a measuring prism, the measuring illumination unit being configured to emit a measuring light which is projected by the projection lens group onto a wafer and reflected by the wafer onto the measuring detector after propagating through the detecting lens group and the measuring prism, thereby forming a measuring mark;
    the first monitoring optical path comprising, sequentially along a direction of propagation of light, a first monitoring illumination unit and the measuring prism, the first monitoring illumination unit being configured to emit a first monitoring light which enters the measuring prism and is then projected onto the measuring detector, thereby forming a first monitoring mark,
    the reference optical path comprising, sequentially along a direction of propagation of light, a reference illumination unit that is independent from the measuring illumination unit, the projection lens group, the detecting lens group and a detecting prism, the reference illumination unit being configured to emit a reference light which is projected by the projection lens group onto a reflective surface other than the wafer, and reflected by the reflective surface onto the reference detector after propagating through the detecting lens group and the detecting prism, thereby forming a reference mark.

2. The measurement device for focusing and leveling according to claim 1, wherein the measuring illumination unit comprises a measuring light source and measuring slits corresponding to the measuring light source, wherein the first monitoring illumination unit comprises a first monitoring light source and first monitoring slits corresponding to the first monitoring light source.

3. The measurement device for focusing and leveling according to claim 2, wherein the measuring light source is provided with a first filter and the first monitoring light source is provided with a third filter.

4. The measurement device for focusing and leveling according to claim 1, wherein the projection lens group comprises, sequentially along the direction of propagation of light, a first projection lens, a projection aperture assembly and a second projection lens.

5. The measurement device for focusing and leveling according to claim 4, wherein the projection lens group further comprises a beam-splitting prism and the detecting lens group further comprises a beam-combining prism, and wherein the measuring light and the reference light are reflected at different surfaces of the beam-splitting prism and at different surfaces of the beam-combining prism.

6. The measurement device for focusing and leveling according to claim 1, wherein the projection lens group further comprises a first reflector and the detecting lens group further comprises a second reflector, and wherein the measuring light is reflected by the first reflector onto the wafer, reflected by the wafer onto the second reflector, and reflected by the second reflector onto the detecting lens group.

7. The measurement device for focusing and leveling according to claim 1, wherein a measuring relay lens group is disposed between the measuring prism and the measuring detector.

8. The measurement device for focusing and leveling according to claim 1, wherein the light in the measuring optical path is in a same wavelength band as the light in the first monitoring optical path.

9. The measurement device for focusing and leveling according to claim 1, further comprising a second monitoring optical path corresponding to the first monitoring optical path, the second monitoring optical path comprising, sequentially along a direction of propagation of light, a second monitoring illumination unit that is independent from the first monitoring illumination unit, and a reference prism, the second monitoring illumination unit being configured to emit a second monitoring light which enters the reference prism and is then projected onto the reference detector, thereby forming a second monitoring mark.

10. The measurement device for focusing and leveling according to claim 9, wherein a measuring relay lens group is disposed between the measuring prism and the measuring detector, and wherein a reference relay lens group is disposed between the reference prism and the reference detector.

11. The measurement device for focusing and leveling according to claim 9, wherein the measuring light is in a same wavelength band as the first monitoring light, and wherein the reference light is in a same wavelength band as the second monitoring light.

12. The measurement device for focusing and leveling according to claim 9, wherein the second monitoring illumination unit comprises a second monitoring light source, second monitoring slits and a fourth filter.

13. The measurement device for focusing and leveling according to claim 1, wherein the reference illumination unit comprises, sequentially along the direction of propagation of light, a reference light source, a second filter and reference slits.

14. The measurement device for focusing and leveling according to claim 13, wherein the light in the measuring optical path transmits through the projection prism and the detecting prism, and wherein the light in the reference optical path is reflected at the projection prism and at the detecting prism.

15. The measurement device for focusing and leveling according to claim 1, wherein the measuring light and the reference light are in different wavelength bands.

16. The measurement device for focusing and leveling according to claim 15, wherein the measuring light is visible light and the reference light is infrared light.

17. The measurement device for focusing and leveling according to claim 1, wherein the reflective surface is provided by a reflector disposed on a bottom surface of the projection objective.

18. A measurement method for focusing and leveling, comprising the steps of:
    1) measuring a wafer by using a measuring light, the measuring light forming a measuring mark on a measuring detector, forming a first monitoring mark on the measuring detector from a first monitoring light, providing a reference light and forming a reference mark on a reference detector from the reference light that propagates in a same direction as the measuring light but does not interact with a surface of the wafer;

2) respectively comparing current positions of the measuring mark and the first monitoring mark on the measuring detector with initial positions of the measuring mark and the first monitoring mark on the measuring detector, and respectively comparing current positions of the reference mark on the reference detector with initial positions of the reference mark;

3) calculating a displacement of the measuring mark and a drift of the first monitoring mark, based on a result of the comparison in step 2), and calculating a drift of the reference mark; and 4) obtaining a compensation for a vertical deviation of the wafer by subtracting the drift from the displacement, and obtaining an optical path drift and obtaining a vertical deviation of the wafer by subtracting both the drift of the first monitoring mark and the optical path drift from the displacement of the measuring mark.

19. The measurement method for focusing and leveling according to claim 18, wherein:

step 1) further comprises:
providing a second monitoring light and forming a second monitoring mark on the reference detector from the second monitoring light;

step 2) further comprises respectively comparing current positions of the second monitoring mark on the reference detector with initial positions of the second monitoring mark on the reference detector;

step 3) further comprises calculating a drift of the second monitoring mark; and step 4) further comprises obtaining an optical path drift by subtracting the drift of the second monitoring mark from the drift of the reference mark and obtaining a vertical deviation of the wafer by subtracting both the drift of the first monitoring mark and the optical path drift from the displacement of the measuring mark.

* * * * *